(12) United States Patent
Chien et al.

(10) Patent No.: US 9,035,275 B2
(45) Date of Patent: May 19, 2015

(54) THREE DIMENSIONAL MEMORY ARRAY ADJACENT TO TRENCH SIDEWALLS

(75) Inventors: Wei-Chih Chien, Taipei (TW);
Ming-Hsiu Lee, Hsinchu (TW);
Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 200 days.

(21) Appl. No.: 13/330,525

(22) Filed: Dec. 19, 2011

(65) Prior Publication Data
US 2013/0153846 A1    Jun. 20, 2013

(51) Int. Cl.
*H01L 29/06*     (2006.01)
*H01L 27/24*     (2006.01)
*H01L 45/00*     (2006.01)

(52) U.S. Cl.
CPC ............. *H01L 27/2409* (2013.01); *H01L 45/04* (2013.01); *H01L 45/1226* (2013.01); *H01L 45/146* (2013.01); *H01L 45/147* (2013.01); *H01L 45/1633* (2013.01); *H01L 27/249* (2013.01)

(58) Field of Classification Search
USPC .................................................. 257/1, 2, 4, 5
See application file for complete search history.

(56) References Cited

U.S. PATENT DOCUMENTS

| | | | |
|---|---|---|---|
| 5,599,724 | A | 2/1997 | Yoshida |
| 6,034,882 | A | 3/2000 | Johnson et al. |
| 6,906,361 | B2 | 6/2005 | Zhang |
| 6,906,940 | B1 | 6/2005 | Lue |
| 7,081,377 | B2 | 7/2006 | Cleeves |
| 7,129,538 | B2 | 10/2006 | Lee et al. |
| 7,177,169 | B2 | 2/2007 | Scheuerlein |
| 7,274,594 | B2 | 9/2007 | Pascucci et al. |
| 7,315,474 | B2 | 1/2008 | Lue |
| 7,382,647 | B1 | 6/2008 | Gopalakrishnan |
| 7,420,242 | B2 | 9/2008 | Lung |
| 7,800,094 | B2 | 9/2010 | Ho et al. |
| 8,203,187 | B2 | 6/2012 | Lung et al. |
| 2005/0280061 | A1 | 12/2005 | Lee |
| 2007/0140001 | A1 | 6/2007 | Motoi et al. |

(Continued)

FOREIGN PATENT DOCUMENTS

| | | |
|---|---|---|
| EP | 1936681 A1 | 6/2008 |
| EP | 2048709 A2 | 4/2009 |

OTHER PUBLICATIONS

Choi et al., "Performance Breakthrough in NOR Flash Memory with Dopant-Segregated Schottky-Barrier (DSSB) SONOS Device", 2009 Symposium on VLSI Technology Digest of Technical Papers, Jun. 16-18, 2009, pp. 1-2.

(Continued)

*Primary Examiner* — Jae Lee
(74) *Attorney, Agent, or Firm* — Haynes Beffel & Wolfeld LLP

(57) ABSTRACT

A self-aligning stacked memory cell array structure and method for fabricating such structure. The memory cell array includes a stack of memory cells disposed adjacent to opposing sides of a conductive line that is formed within a trench. The memory cells are stacked such that the memory element surface of each memory cell forms a portion of the sidewall of the conductive line. The conductive line is formed within the trench such that electrical contact is made across the entire memory element surface of each memory cell. Such structure and method for making such structure is a self-aligning process that does not require the use of any additional masks.

16 Claims, 15 Drawing Sheets

(56) References Cited

U.S. PATENT DOCUMENTS

| | | |
|---|---|---|
| 2007/0252201 A1 | 11/2007 | Kito et al. |
| 2008/0096327 A1 | 4/2008 | Lee et al. |
| 2008/0101109 A1 | 5/2008 | Haring-Bolivar et al. |
| 2008/0180994 A1 | 7/2008 | Katsumata et al. |
| 2008/0247230 A1 | 10/2008 | Lee et al. |
| 2008/0265235 A1 | 10/2008 | Kamigaichi et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2013/0001494 A1* | 1/2013 | Chen et al. ............. 257/1 |

OTHER PUBLICATIONS

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Anti-fuse Memory Cells" IEEE J. of Solid-State Circuits, vol. 38, No. 11, Nov. 2003.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory", IEEE Int'l Electron Devices Meeting, Dec. 11-13, 2006.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory", 2007 Symposium on VLSI Technology Digest of Technical Papers; Jun. 12-14, 2007, pp. 14-15.

\* cited by examiner

THREE DIMENSIONAL MEMORY ARRAY ADJACENT TO TRENCH SIDEWALLS

BACKGROUND OF THE INVENTION

1. Field of the Invention

The present invention relates to three dimensional memory cell array devices and methods for forming such devices.

2. Description of Related Art

Some metal-oxides can be caused to change resistance between two or more suitable ranges by application of electrical pulses at levels suitable for implementation in integrated circuits. Metal-oxides have generated interest in use in resistive random access memory (RRAM) devices because of their simple structure, compatibility with standard CMOS processes, high speed, low power consumption, and potential for 3D stacking.

Tungsten oxide $WO_x$ based RRAM has been shown to exhibit good resistive switching characteristics between two or more resistance ranges. See, U.S. Pat. No. 7,800,094 entitled "Memory Devices Having an Embedded Resistance Memory with Tungsten Compound and Manufacturing Methods," filed 12 Dec. 2007.

As the amount of required data storage increases, it is important to maximize the number of memory cells that can be formed within an array on a single substrate. One solution is to just create a larger die and add more memory cells along the horizontal plane in which the memory cells are formed. Another solution is to create a three dimensional structure, wherein memory cells are stacked on top of each other. While stacked memory cell arrays provide increased data storage on a die having the same footprint as a die of a memory cell array formed from a single layer of memory cells, it is difficult to ensure that strong electrical contact is made over the entire input and output surfaces of a memory element of each memory cell of the array between the memory cell and the bit line, and between the memory cell and the word line. This ensures that a maximum amount of current is passed through the memory cell during program and read operations.

Furthermore, ensuring that good electrical contact is made between the entire input and output surfaces of the memory element and the word and bit lines, involves the implementation of multiple additional masks and etching steps. Such additional masks and etching steps ensure that the contact conductor is uniformly deposited to make complete contact over the entire and input and output surfaces, but require numerous steps that add to manufacturing costs.

It is therefore desirable to provide a memory cell array of a stacked structure that ensures that good electrical contact is made over the entire surfaces of the memory element between of each memory cell of the array through an inexpensive and easily implemented self-aligning process.

SUMMARY OF THE INVENTION

Stacked memory cell array structures and methods for creating such structure are described. The memory cell array structures include memory elements that are formed adjacent to opposing sides of a conductive line that is formed within a trench. The memory elements are formed adjacent to opposing sides of the conductive line in a stacked configuration whereby one memory cell is disposed vertically on top of the other. An array of vertical connectors can be used to electrically couple the memory elements to the overlying circuitry. The overlying circuitry can include word lines coupled to the array of vertical connectors. In one embodiment the conductive line is a bit line. The memory cell array structure can include a drive device layer disposed between the conductive line and the memory elements to control the amount of current passing through the memory cells and allow for further selectivity control during array program and read operations.

The structure can be specifically applied to stacked memory cell array structures using RRAM memory cells. The RRAM memory cells can include a plurality of conductive pads that are disposed adjacent to the opposing sides of a conductive line. Each conductive pad includes a proximal side that corresponds to one of the opposing sides of the conductive line. The proximal side is proximal to the conductive line within a trench. A metal oxide memory element is formed on the proximal sides of the conductive pads, such that the metal oxide memory element is disposed between the conductive pads and the conductive line.

Such structure can include an oxide growth barrier layer formed within the trench in which the conductive line is formed, to prevent growth of the resistive metal oxide memory into the trench during oxidation. The oxide growth barrier layer also can provide a surface upon which the conductive line can be formed, thereby creating a strongly bonded electrical contact.

In one embodiment at least two of the plurality of conductive pads are stacked such that at least a first conductive pad is disposed above a second conductive pad, and the first conductive pad has a distal side that is disposed closer to the conductive line than the distal side of the second conductive pad, the distal sides of the first and second conductive pads in electrical communication with corresponding ones of the array of vertical connectors.

In one embodiment the plurality of conductive pads each include a metal layer between one of the metal oxide memory elements and one of the array of vertical connectors. An oxide of the metal layer is a resistive metal oxide memory element, such that the resistive metal oxide memory element is disposed on the proximal side of the metal layers in the conductive pads. In one embodiment the plurality of conductive pads further includes a plurality of barrier metal layers in which the metal layer is disposed between at least two of the metal barrier layers. In one embodiment the plurality of conductive pads further includes at least one field enhancement structures adjacent to proximal ends of the metal oxide memory elements proximal to the corresponding one of the first and second sidewalls of the trench. In one embodiment an oxide growth barrier layer is disposed between at least one of the metal oxide memory elements and one of the corresponding first and second sides of the conductive line. In one embodiment a drive device layer is disposed between at least one of the metal oxide memory elements and one of the corresponding first and second sides of the conductive line.

The method of forming such structure includes the following steps:

forming a plurality of levels of a plurality of conductive pads adjacent to a first and a second sidewall of a trench, the plurality of conductive pads having proximal sides proximal to a corresponding one of the first and second sidewalls of the trench;

forming a plurality of metal oxide memory elements on the proximal sides of the plurality of conductive pads;

forming a conductive line within the trench such that the conductive line is in electrical communication with the plurality of metal oxide memory elements; and forming an array of vertical connectors that are in electrical communication with respective conductive pads in the plurality of levels.

The method can further include the step of depositing a drive device layer within the trench such that the drive device layer is disposed between the memory elements and the conductive line.

The method can be specifically applied to stacked memory cell array structures using RRAM memory cells. Such method can further include forming an oxide growth barrier layer within the conductive line trench before the step of oxidation.

Other embodiments are disclosed herein.

Other aspects and advantages of the present invention can be seen on review of the drawings, the detailed description, and the claims which follow.

DETAILED DESCRIPTION

A detailed description of embodiments of the present invention is provided with reference to the FIGS. 1-15.

The memory cell array stacked structure described herein is described with specific reference to resistive metal oxide memory cells. The description of the three dimensional memory cell architecture, however, is not limited solely to use in resistive metal oxide memory cells and can be used with various memory cell designs. Such various memory cell designs include but are not limited to phase change memory cells, magneto resistive memory cells or spin-transfer torque magneto resistive memory cells. Furthermore, the memory cell array stacked structure is not limited to just two memory cells stacked on top of each other and can be used to create a design of greater than two memory cells stacked on top of each other.

Figure 1:
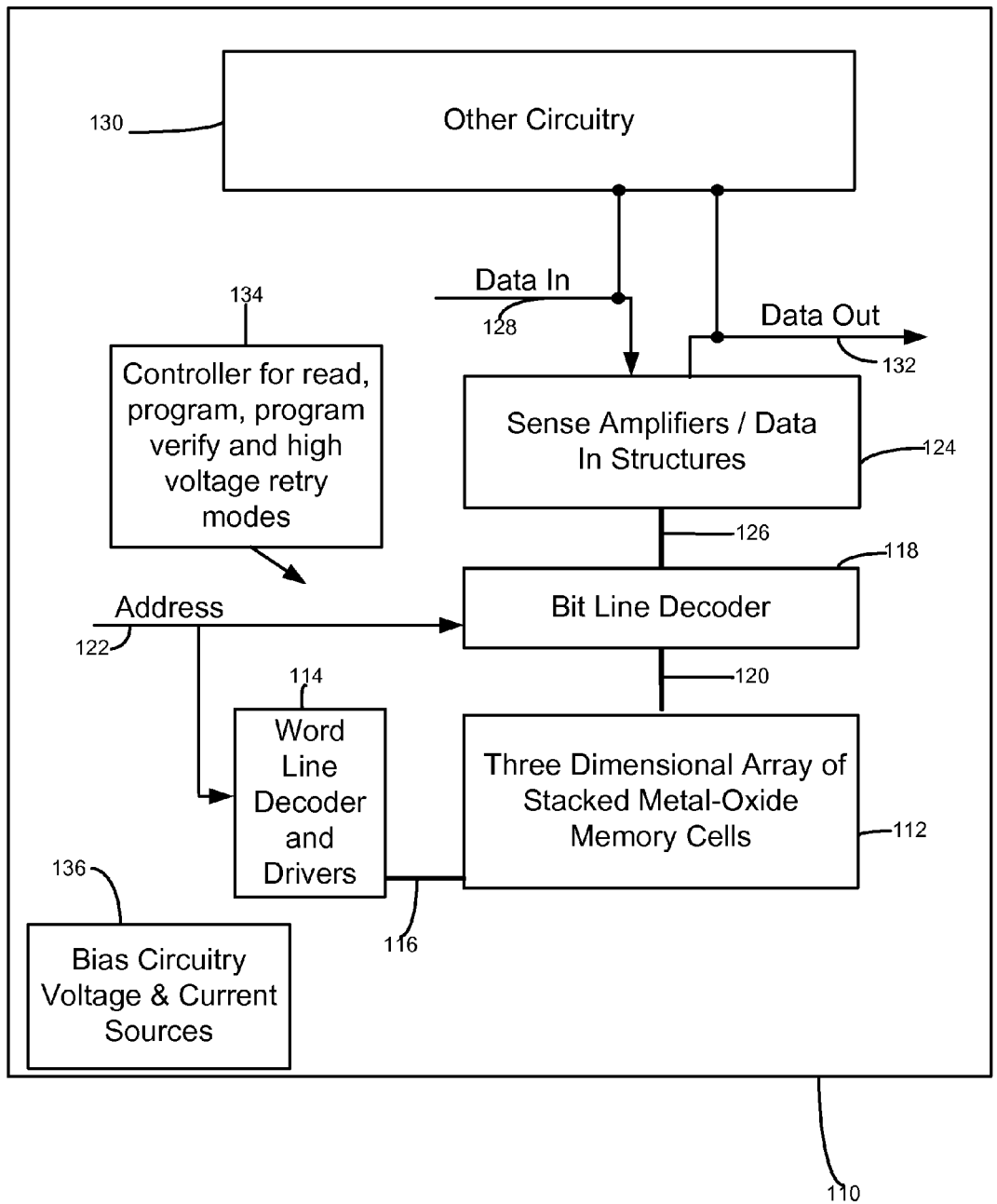
FIG. 1 is a simplified block diagram of an integrated circuit including a memory array of memory cells of a stacked structure having resistive metal oxide memory elements.

FIG. 1 is a simplified block diagram of an integrated circuit 110 including a memory array 112 of memory cells having metal-oxide memory elements which can be operated as described herein. A word line decoder 114 having read, program, program verify and high voltage program retry modes is coupled to and in electrical communication with a plurality of word lines 116 arranged along rows in the memory array 112. A bit line (column) decoder 118 is in electrical communication with a plurality of bit lines 120 arranged along columns in the array 112 for reading and programming the metal-oxide memory cells in the memory array 112. The plurality of bit lines are formed from a plurality of conductive lines that are each formed within a trench and coupled to stacks of memory cells that are adjacent to the sides of each conductive line. Addresses are supplied on bus 122 to word line decoder and drivers 114 and bit line decoder 118. Sense amplifiers and data-in structures in block 124, including voltage and/or current sources for the read, program, program verify and high voltage program retry modes are coupled to bit line decoder 118 via data bus 126. Data is supplied via a data-in line 128 from input/output ports on integrated circuit 110, or from other data sources internal or external to integrated circuit 110, to data-in structures in block 124. Other circuitry 130 may be included on integrated circuit 110, such as a general purpose processor or special purpose application circuitry, or a combination of modules providing system-on-a-chip functionality supported by array 112. Data is supplied via a data-out line 132 from the sense amplifiers in block 124 to input/output ports on integrated circuit 110, or to other data destinations internal or external to integrated circuit 110.

A controller 134 implemented in this example using a bias arrangement state machine, includes logic which controls the application of bias circuitry voltage and current sources 136 for the application of bias arrangements described herein. Controller 134 may be implemented using special-purpose logic circuitry as known in the art. In alternative embodiments, controller 134 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 134.

Figure 2:
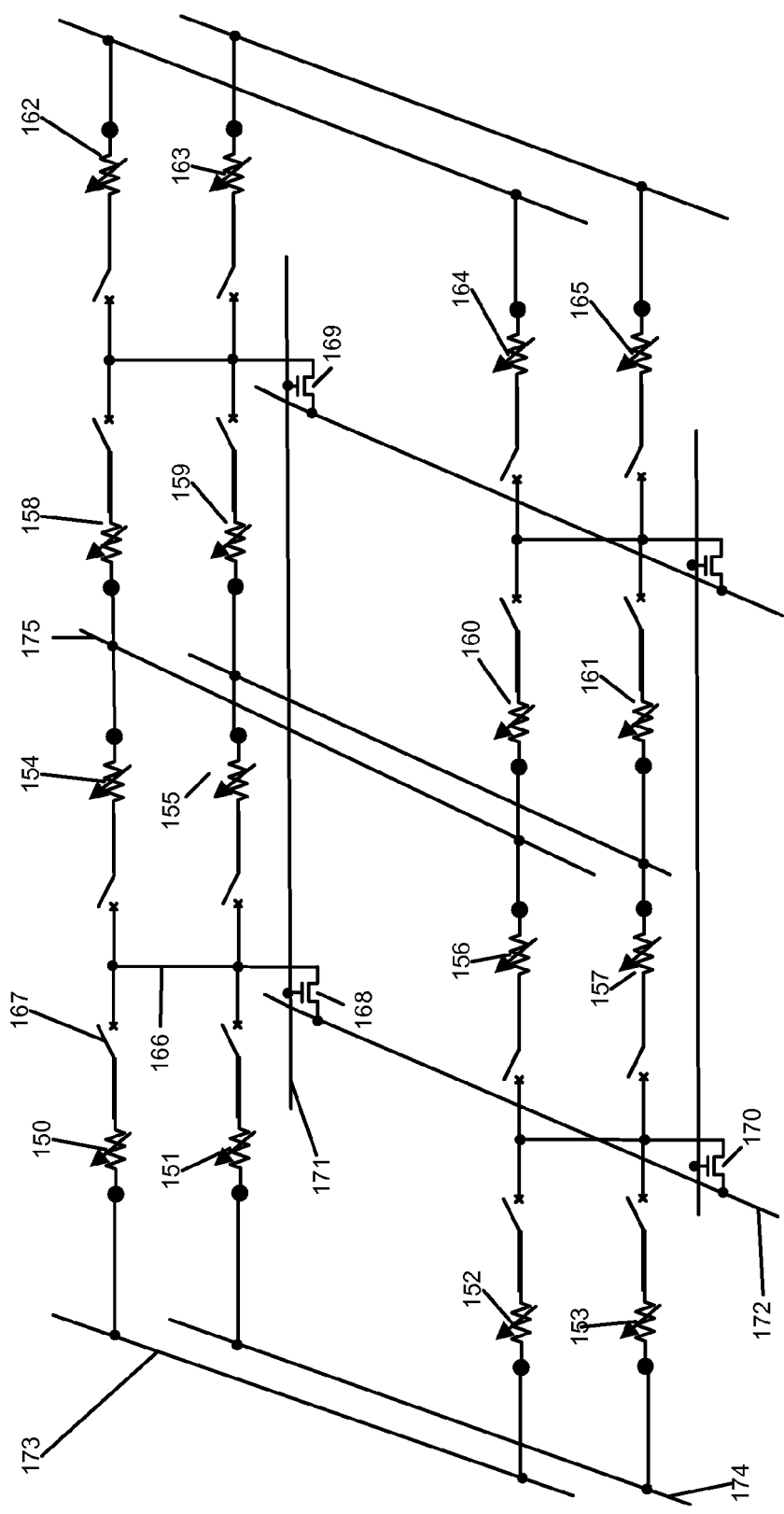
FIG. 2 is a circuit diagram of a portion of the integrated circuit of FIG. 1.

FIG. 2 is a schematic circuit diagram showing a portion of the circuit of the memory array of FIG. 1. The circuit includes a three dimensional array of stacked memory cells including memory cells elements 150-165. Each memory cell within opposing stacked structures, for example memory cells 150, 151, 154 and 155, are individually connected to a common line 166 through a separate switching element 167. Such switching element can be a diode that limits the passing of current through each memory cell 150-165. The common line 166 is connected to a transistor 168 that controls the bias voltage that is applied along the common line 166 to each memory cell within the opposing stacked structures, for example memory cells 150, 151, 154 and 155. Each transistor 168 is connected to a first common word line 171 and a first common bit line 172. The common word line 171 is connected to a transistor 169 that is next to transistor 168. The common bit line 172 is connected to another transistor 170 that is next to transistor 168.

Each memory cell element 150-165 in this example array has a corresponding memory cell element in an adjacent opposing stacked structure of memory cell elements. For example memory cell element 151 corresponds to memory cell element 153, memory cell element 150 corresponds to memory cell element 152, memory cell element 154 corresponds to memory cell element 156 and memory cell element 155 corresponds to memory cell element 157. Corresponding memory cell elements are connected to shared lines. For example corresponding memory cell elements 150 and 152 are connected to a first shared line 173. In addition, corresponding memory cell elements 151 and 153 are connected to a second shared line 174. Each shared line is also connected to the corresponding memory elements that are in the adjacent stacked structures. For example, corresponding memory cell elements 154 and 156 are connected to a third shared line 175. The third shared line 175 is also connected to corresponding memory cell elements 158 and 160 in the adjacent stacked structures of memory cell elements. Such configuration allows for the control of applied bias voltages to allow for the selective reading and writing of memory cell elements 150-165 within the three dimensional array of stacked memory cell elements 150-165.

Figure 3:
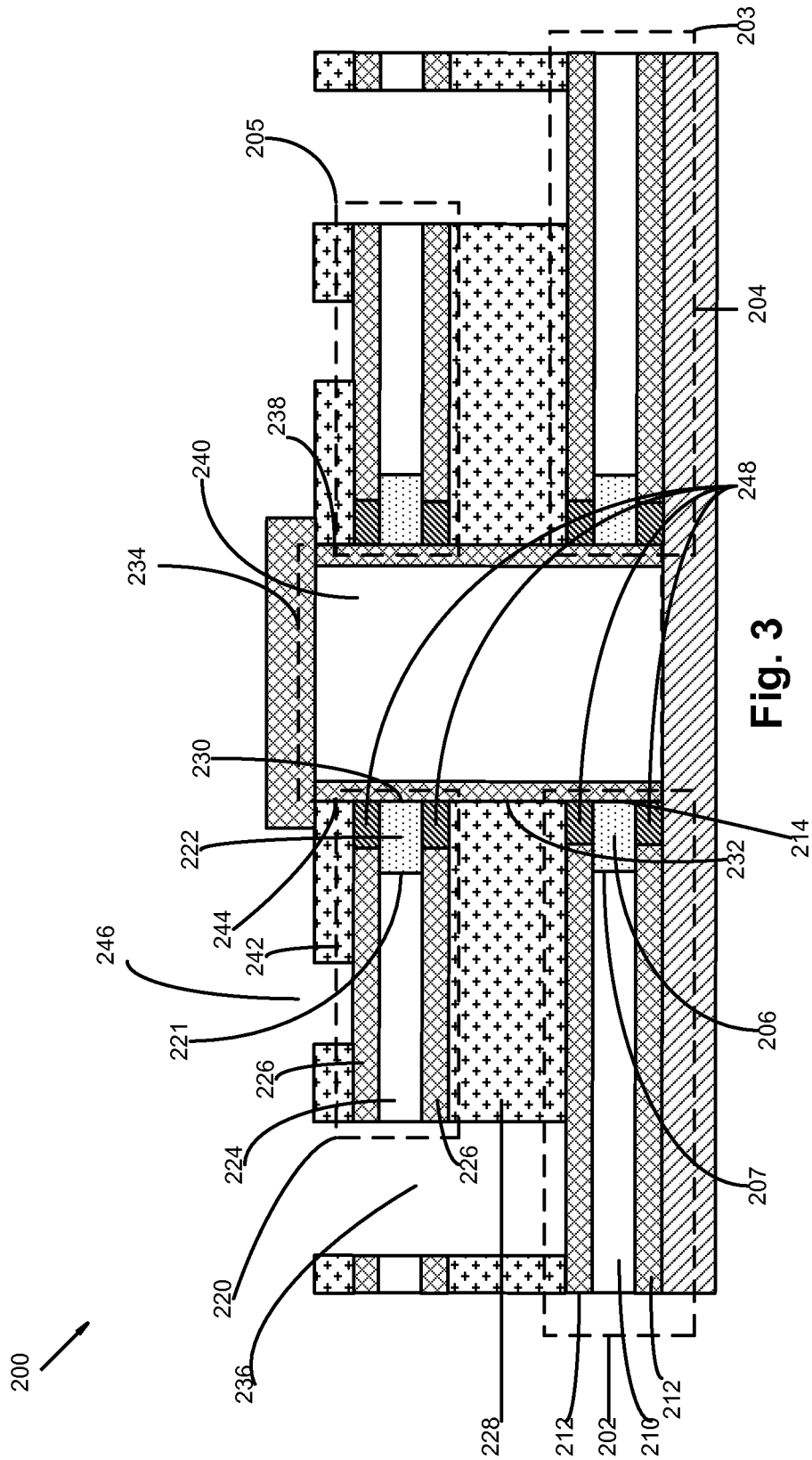
FIG. 3 is a cross sectional view of a memory cell array of a stacked structure.

FIG. 3 shows a cross sectional view of a memory cell array stacked structure. The three dimensional memory cell array 200 includes a first memory cell 202, a second memory cell 220, a third memory cell 203 and a fourth memory cell 205. The first memory cell 202 is formed on substrate 204, adjacent to trench 234. The substrate 204 can be any material that is suitable for forming a memory cell on top of the substrate, including but not limited to $SiO_2$.

The first memory cell 202 includes a conductive pad that is adjacent to trench 234. The conductive pad includes the metal layer 210 that is sandwiched between barrier metal layers 212. Like materials, such as the top and bottom barrier metal layers 212 of the sandwich, are shown with like texture in the figures. The conductive pad has a proximal side 207 that corresponds to the sidewall of the trench 234. The proximal side 207 is proximal to the trench 234. The barrier metal layers 212 can be of any suitable barrier metal material, including but not limited to Co, Ru, Ta, TaN, InN, TuN or TiN. The barrier metal layers 212 serve to prevent the diffusion of material from the metal layer 210 and the resistive metal oxide memory element 206 during the operational lifecycle of the memory cell. The barrier metal layers 212 further have a sufficient conductivity to create good electrical contact to a via, thereby allowing the flow of current through the metal layer 210 and resistive metal oxide memory element during device operation.

The first memory cell 202 includes a resistive metal oxide memory element 206. The resistive metal oxide memory element 206 is formed along the surface of a metal layer 210 on the proximal side 207 of the conductive pad. The metal layer 210 can be any metal material that is suitable for oxidizing to form a resistive metal oxide material layer. The metal layer 210 can be of any suitable material for forming a resistive metal oxide adjacent to, including but not limited to W, Ti, Ni, Al, Cu, Zr, Nb, Ta, TiN, Cr-doped SrZr, Cr-doped SrTi, PCM or LaCaMn. The resistive metal oxide memory element 206 can be of any resistive metal oxide material that changes resistivity as different voltages are applied and after a sufficiently high current passes through the element 206. Such change in resistance is used to represent a bit in the storage of data. Such materials include but are not limited to WO, TiO, NiO, AlO, CuO, ZrO, NbO, TaO, TiNO, Cr-doped SrZrO3, Cr-doped SrTiO3, PCMO or LaCaMnO.

A second memory cell 220 is positioned above the first memory cell 202 in a stacked structure. Such stacked structure creates a three dimensional array of memory cells. Such three dimensional stacked structure allows for the creation of a memory array with a larger number of cells, than a memory array with the same planar footprint.

The second memory cell 220 can be of a similar design to the first memory cell 202. Specifically, the second memory cell includes a conductive pad that is adjacent to a side of the trench 234. The conductive pad has a proximal side 221 that corresponds to the sidewall of the trench. The pad includes metal layer 224 that is sandwiched between barrier metal layers 226. A resistive metal oxide memory element 222 is formed from a metal layer 224. The metal layer 224 can be fabricated from the same materials as the metal layer 210 of the first memory cell 202. The barrier material layers 226, as with the first memory cell serve to prevent diffusion of material out of the resistive metal oxide memory element 222 and the metal layer 224, while still being electrically conductive for the formation of electrode contacts. The barrier metal layers 226 of the second memory cell 220 can be formed from the same materials that are used to form the barrier metal layers 212 of the first memory cell 202.

The second memory cell 220 includes a resistive metal oxide memory element 222 that is formed along the surface of the metal layer 224 that is along the proximal side 221 of the conductive pad.

The first and second resistive metal oxide memory elements 206 and 222 include respective memory element surfaces 214 and 230 that make up a portion of the sidewall of the trench 234. The resistive metal oxide memory elements 206 and 222 have opposite sides—one side of the resistive metal oxide memory elements 206 and 222 is the memory element surfaces 214 and 230, and another side of the resistive metal oxide memory elements 206 and 222 contacts the metal layers 210 and 224 along the proximal sides 207 and 221 of the conductive pads. The memory element surfaces 214 and 222 are disposed such that the current that flows through the surfaces 214 and 222, also flows directly into or out of the resistive metal oxide memory elements 206 and 222.

The first memory cell 202 and second memory cell 220 are separated by a first isolation layer 228. Such first isolation layer 228 is formed out of an insulator material in order to prevent the flow of current between the memory cells, thereby electrically isolating the first memory cell 202 from the second memory cell 220. The insulator material that is used to fabricate the isolation layer 228 can be but is not limited to SiN. The isolation layer is positioned between the bottom surface of the second memory cell 220 and the top surface of the first memory cell 202. The first isolation layer 228 covers substantially all of the bottom surface of the second memory cell 220 to ensure that current does not leak from the second memory cell 220 to the first memory cell 202 and vice versa during programming and reading of the first and second memory cells 202 220.

The stacked memory cell structure also includes a second isolation layer 242 that is positioned on top of the second memory cell 220. The second isolation layer can be made of any insulator material, including but not limited to SiN. The second isolation layer 242 serves to electrically isolate the second memory cell 220. In particular, the second isolation layer 242 electrically isolates the second memory cell 220 from the portion of the conductive line that overhangs and contacts the top of the second isolation layer 242. This helps to ensure that during device read and program operations, current leakage into the second memory cell from rest of the memory cell array 200 is minimized.

The first memory cell 202, the second memory cell 220 and the isolation layers 228 and 242 are stacked on top of each other such that the resistive metal oxide memory element contact interfaces 214 and 230 of the first and second memory cells are aligned in the same plane. The isolation layers 228 and 242 includes sides 232 and 244 that are also in the same plane as the memory element surfaces 214 and 230, thereby forming part of a planar surface. Such planar surface has a position along the sidewall of a conductive line trench 234. The previously mentioned surfaces 214 and 230 and isolation sides 232 and 244 are also along the same planar surface having a position along the sidewall of the trench 234.

A stacked structure similar to the first and second memory cells 202 and 220 is formed adjacent to the opposing side of the trench 234. Such stacked structure formed adjacent to the opposing side includes third and fourth memory cells 203 and 205. The third and fourth memory cells can be of a similar structure as the first and second memory cells 202 and 220. Such similar stacked structure includes memory element surfaces on the resistive metal oxide memory element of each memory cell that are along the proximal side of the conductive pads. The proximal side is proximal to the trench 234. The trench 234 has opposite sidewalls—one adjacent to first and second memory cells 202 and 220, and another adjacent to third and fourth memory cells 203 and 205. The memory element surfaces of the third and fourth memory cells 203 and 205 are positioned along a sidewall of the trench 234 that is adjacent to third and fourth memory cells 203 and 205.

A conductive line is formed within the trench 234 to provide an electrical contract to both the first and second memory cells 202 and 220 and the third and fourth memory cells 203 and 205. The conductive line forms a common line for the memory cells 202, 220, 203 and 205 in the array during program and read operations. As discussed previously, the memory element surfaces of the memory cells 202, 220, 203 and 205 are positioned along the sidewalls of the trench 234. Forming the conductive line within the trench such that the entire trench is filled, ensures that good electrical contact is made between the conductive line and the entire surface of each of the memory element surfaces of the memory cells 202, 220, 203 and 205. Thus, the process of forming the conductive line within a trench is a self-aligning process. This self-aligning process does not use any additional masks or etching processes to ensure that good electrical contact is made across the entire memory element surface of each resistive metal oxide memory element of the memory cells 202, 220, 203 and 205 within the three dimensional stacked array. Such a self-aligning process reduces the manufacturing costs of such devices and the risk of manufacturing defects.

In the embodiment shown in FIG. 3, the conductive line includes a barrier metal layer 238 that is deposited on the bottom and sidewalls of the trench 234, and includes a metal layer 240. The barrier metal layer 238 can be formed from any of the previously mentioned barrier metal materials. The metal layer 240 is formed adjacent to the barrier metal layer 238 within the trench 234. The metal layer 240 may comprise, for example, one or more elements selected from the group consisting of Ti, W, Yb, Tb, Y, Sc, Hf, Zr, Nb, Cr, V, Zn, Re, Co, Rh, Pd, Pt, Mo, Al, Ta, Cu, Pt, Ir, La, Ni, N, O, and Ru and combinations thereof. The barrier metal layer 238 serves as an adhesion layer to create a surface to which the metal layer 240 can bond more easily. The barrier metal layer 238 extends out of the trench 234 and around the metal layer 240 on the top of the stacked memory cell structure to encapsulate the metal layer 240. Thus the barrier metal layer 238 of the conductive line forms the surface on the top of the stacked memory cell structure, to which electrical contact is made during subsequent processing and packaging. The use of a barrier metal layer 238 further provides an adhesive surface, to which electrical contact is made during subsequent processing and packaging can bond more easily than the resistive metal oxide memory element contact interfaces 214 and 230.

Each memory cell 202, 220, 203 and 205 includes a corresponding array of vertical connectors. The array of vertical connectors provides electrical contact to overlying circuitry. The array of vertical connectors includes a first memory cell back via 236 that extends through the second isolation layer 242, the second memory cell 220 and the first isolation layer 228 to the top surface of the barrier metal layer 212 of the first memory cell 202. The via 236 includes a conductive material that is used to make electrical contact to the first memory cell 202. The electrode may comprise, for example, one or more elements selected from the group consisting of Ti, W, Yb, Tb, Y, Sc, Hf, Zr, Nb, Cr, V, Zn, Re, Co, Rh, Pd, Pt, Mo, Al, Ta, Cu, Pt, Ir, La, Ni, N, O, and Ru and combinations thereof. Such electrical contact between the conductive material within the via 236 and the first memory cell 202 allows current to flow through the barrier metal layer 212 into the metal layer 210 and the resistive metal oxide memory element 206. The via 236 can include an insulating layer that is formed along the sidewalls of the via 236. The insulating layer ensures that the conductive material filled within the via 236 remains electrically isolated from the second memory cell 220.

A second memory cell via 246 extends through the second isolation layer 242 to the top surface of the barrier metal layer 226 of the second memory cell 220. A conductive material is formed within the second memory cell via 246 to create good electrical contact between overlying circuitry and the second memory cell 220. Conductive material within the second memory cell via 246 may comprise, for example, one or more elements selected from the group consisting of Ti, W, Yb, Tb, Y, Sc, Hf, Zr, Nb, Cr, V, Zn, Re, Co, Rh, Pd, Pt, Mo, Al, Ta, Cu, Pt, Ir, La, Ni, N, O, and Ru and combinations thereof. As with the first memory cell via 236, forming the second memory cell via 246 down to the top of the barrier metal layer 226 creates electrical contact as current can flow from the electrode, through the barrier metal layer 226 and into the metal layer 224 and the resistive metal oxide memory element 222.

The third and fourth memory cells 203 and 205 can include a vias that make electrical contact with overlying circuitry. Such vias of the third and fourth memory cells 203 and 205 can be of the same structure as the vias 236 and 246 of the first and second memory cells 202 and 220.

The first and second memory cell resistive metal oxide memory elements 206 and 222 can include field enhancement layers 248. As shown in FIG. 3, the field enhancement layers 248 have a material that is formed adjacent to the barrier metal layers 212 and 226 and covers a portion of the top and bottom horizontal surfaces of the first and second memory cell resistive metal oxide elements 206 and 222. The field enhancement layers 248 may for example comprise TiNO, $SiO_2$, HfO, TiO, AlO, WO, etc, and is preferably chosen so that the material of the field enhancement layers 248 has a higher resistance than that of the memory cell resistive metal oxide elements 206 and 222.

Figure 4:
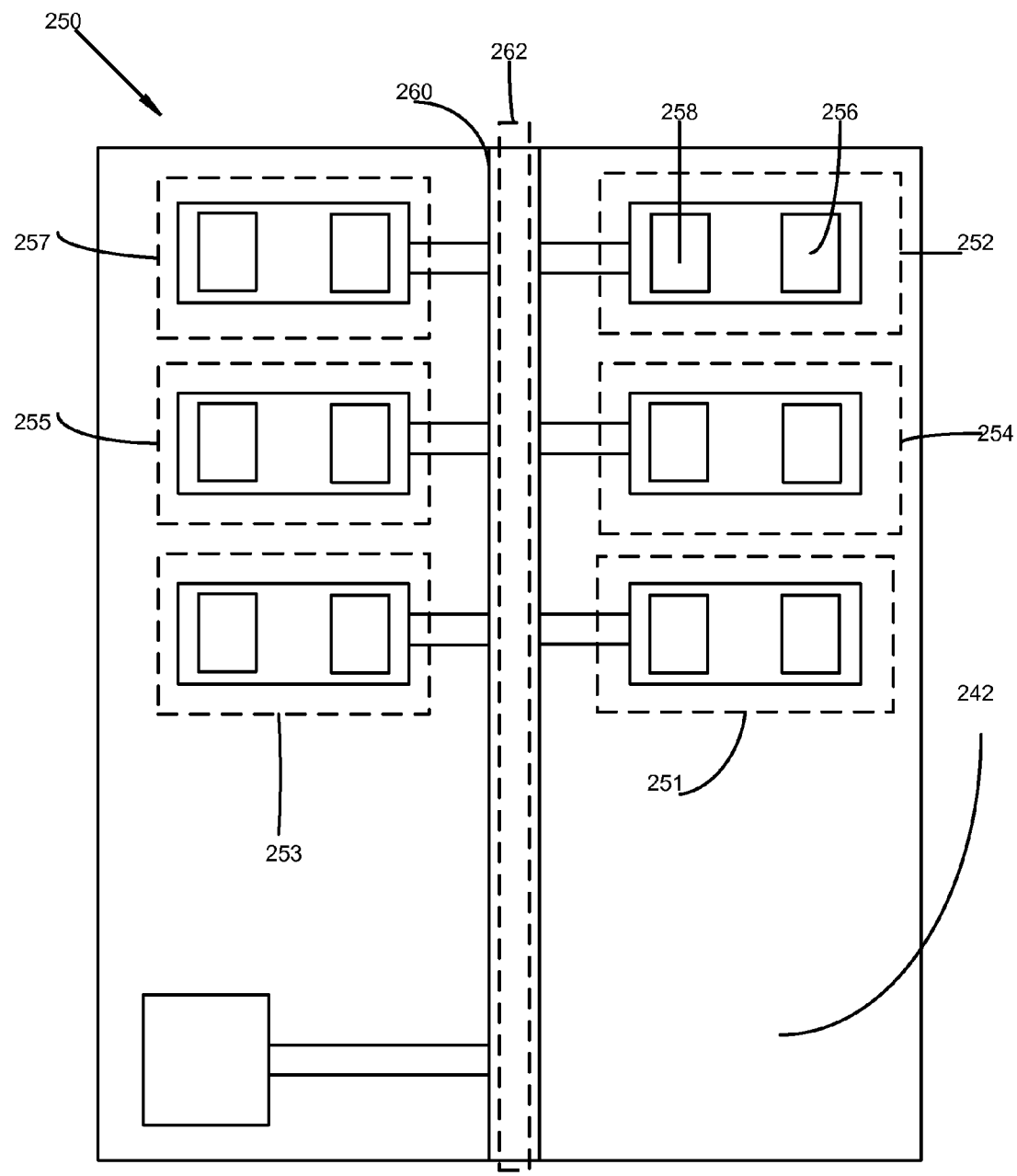
FIG. 4 is a layout view of the memory cell array described in FIG. 3 including the back electrodes.

FIG. 4 shows a layout view of a memory array 250 using the stacked memory cell structure as described in FIG. 3 with the formed electrodes. The memory array 250 includes at least memory cell stacked structures 251, 252, 253, 254, 255 and 257. The memory cell stacked structures can be positioned in a staggered fashion, whereby the memory cell stacked structures are not directly across from each other on adjacent sides of the trench 262, such that mirror symmetry does not exist along the axis of the trench 262.

Each memory cell stacked structure includes a first back via 256 and a second back via 258. The first and second back vias 256 and 258 are disposed such that the isolation layer 242 separates the first and second back vias 256 and 258 along the top surface, to ensure that the first and second back vias 256 and 258 are electrically isolated from each other. Such electrical isolation between the back vias 256 and 258 allows the memory cells within the memory cell stacked structure 251, 252, 253, 254, 255 and 257 to be programmed or read in selected groups. Within each memory cell structure 251, 252, 253, 254, 255 and 257, the back vias 256 and 258 electrically couple each memory cell to overlying circuitry.

Each stacked memory cell structure 251, 252, 253, 254, 255 and 257 is coupled to a conductive line 260. The conductive line 260 is formed within a trench 262. As discussed previously, the memory element surfaces of the memory cells of each stacked memory cell structure form a portion of the sidewalls of the trench 262. Depositing the conductive line 260 within such trench 262, where the memory element surfaces make up a portion of the sidewalls, ensures that the conductive line 260 makes complete electrical contact with the entire memory element surfaces of the resistive metal oxide memory elements of each memory cell within each stacked memory cell structure 251, 252, 253, 254, 255 and 257. Thus the formation of the conductive line 260 in the trench 262 is a self aligning process that does not require the use of additional masks to ensure that complete electrical contact is made with the resistive metal oxide memory elements. The conductive line 260 can serve as a common line during a read or programming operation. Such conductive line, in serving as a common line, can be coupled to overlying circuitry, shown in FIG. 1.

The conductive line 260 and each first back via 256 and second back via 258 are separated by the second isolation layer 242 along the top surface of the memory array 250. The second isolation layer, as previously described, can be any material that is capable of electrically isolating the components of the memory array, including the conductive line 260 and each first memory cell back electrode 258 and second memory cell back electrode 258.

Figure 5:
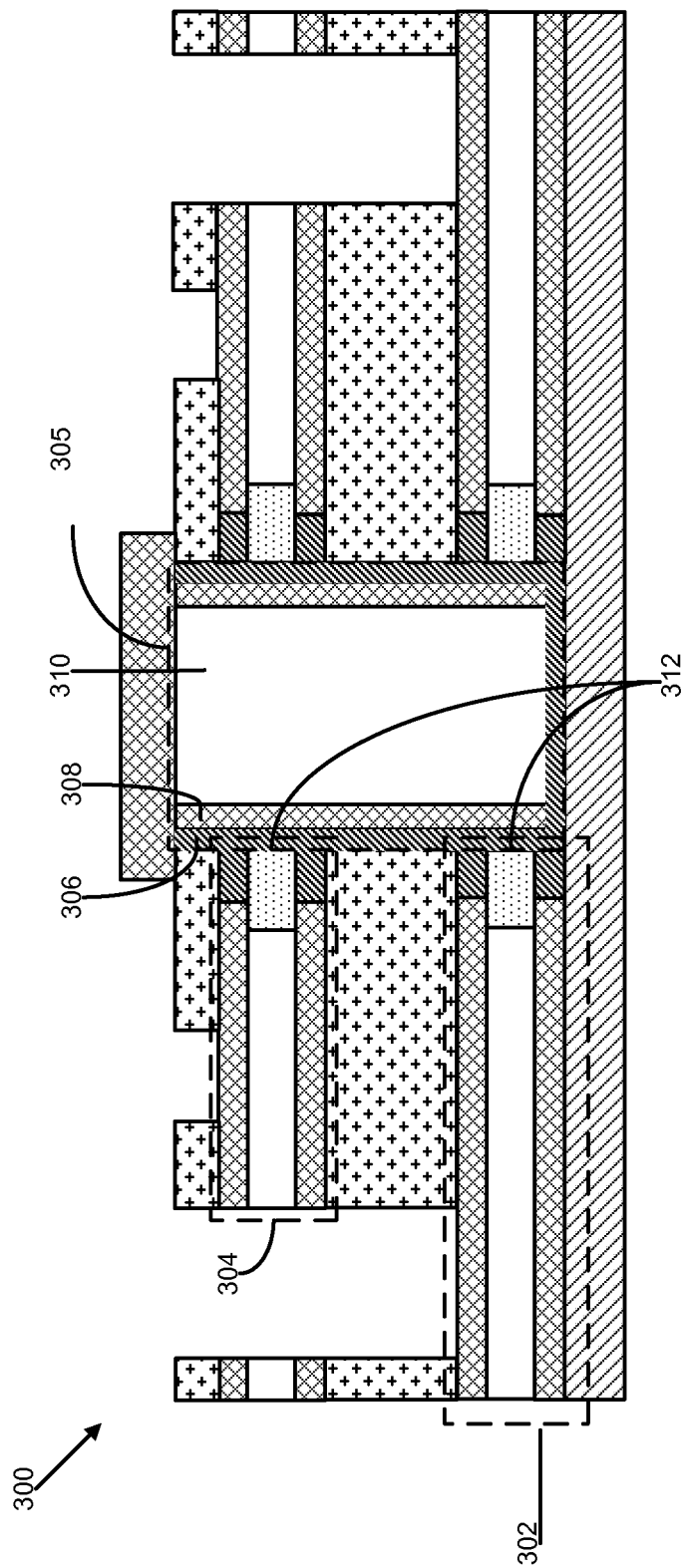
FIG. 5 is a cross sectional view of a memory cell array of a stacked structure with an oxide growth barrier layer.

FIG. 5 shows a cross sectional view of an alternate embodiment of a stacked memory cell array structure 300 including an oxide growth barrier layer 306. The stacked memory cell array structure 300 in FIG. 5 includes a first memory cell 302 and second memory cell 304. The memory cells 302 and 304 within the stacked structure can be resistive metal oxide memory cells of the same structure as previously described in FIG. 3. The conductive line of the stacked memory array structure described in FIG. 5, includes an oxide growth barrier layer 306. The oxide growth barrier layer 306 is formed within the trench in a layer along the sidewall before the resistive metal oxide memory elements are formed.

The oxide growth barrier layer 306 allows oxygen atoms to diffuse through the oxide growth barrier layer 306 during the oxidation process while still maintaining a bulk stoichiometry similar to the as-formed oxide growth barrier layer 306 throughout oxidation and other material deposition and etching processes. Furthermore, the oxide growth barrier layer 306 serves to prevent the generation of roughness and defects during oxidation on the metal oxide memory element interfaces 312 that comprise a portion of the sidewall of the trench. The oxide growth barrier layer 306 is formed on the contact interface of the metal oxide memory element 312, thereby limiting growth of the oxide memory element into the shared trench during the oxidation process. Limiting the metal oxide memory element contact interfaces 312 into the trench 305, ensures that a strong electrical contact is created between the oxide barrier growth layer 306, the conductive line and the resistive metal oxide memory elements of the first and second memory cells 302 and 304. Finally, the oxide growth barrier layer 306 provides a surface upon which the conductive line can adhere to more easily than the memory element surfaces 312, The conductive line can include a barrier metal layer 308 formed between the oxide growth barrier layer 306 and the metal layer 310. This ensures that a strong electrical contact is formed between the resistive metal oxide memory elements and the conductive line.

The oxide growth barrier layer 306 can be any material that is capable of allowing oxygen atoms to diffuse through it during oxidation processes. Furthermore, such oxide growth barrier layer 306 must be capable of maintaining a bulk stoichiometry similar to the as-formed oxide growth barrier layer at elevated oxidation and processing temperatures, to help ensure that atoms from within the oxide growth barrier layer do not diffuse into the memory cells. Finally, such oxide growth barrier layer 306 is capable of conducting charge either as a conductor or as a dielectric in an applied electric field. Such electrical conductivity of the oxide growth barrier layer 306 ensures that sufficient current passes from the resistive metal oxide memory element through the oxide growth barrier layer 306 and into the conductive line during memory cell program and read operations. The oxide growth barrier layer 306 can be TiNO or any other material with the characteristics described in this paragraph.

Figure 6:
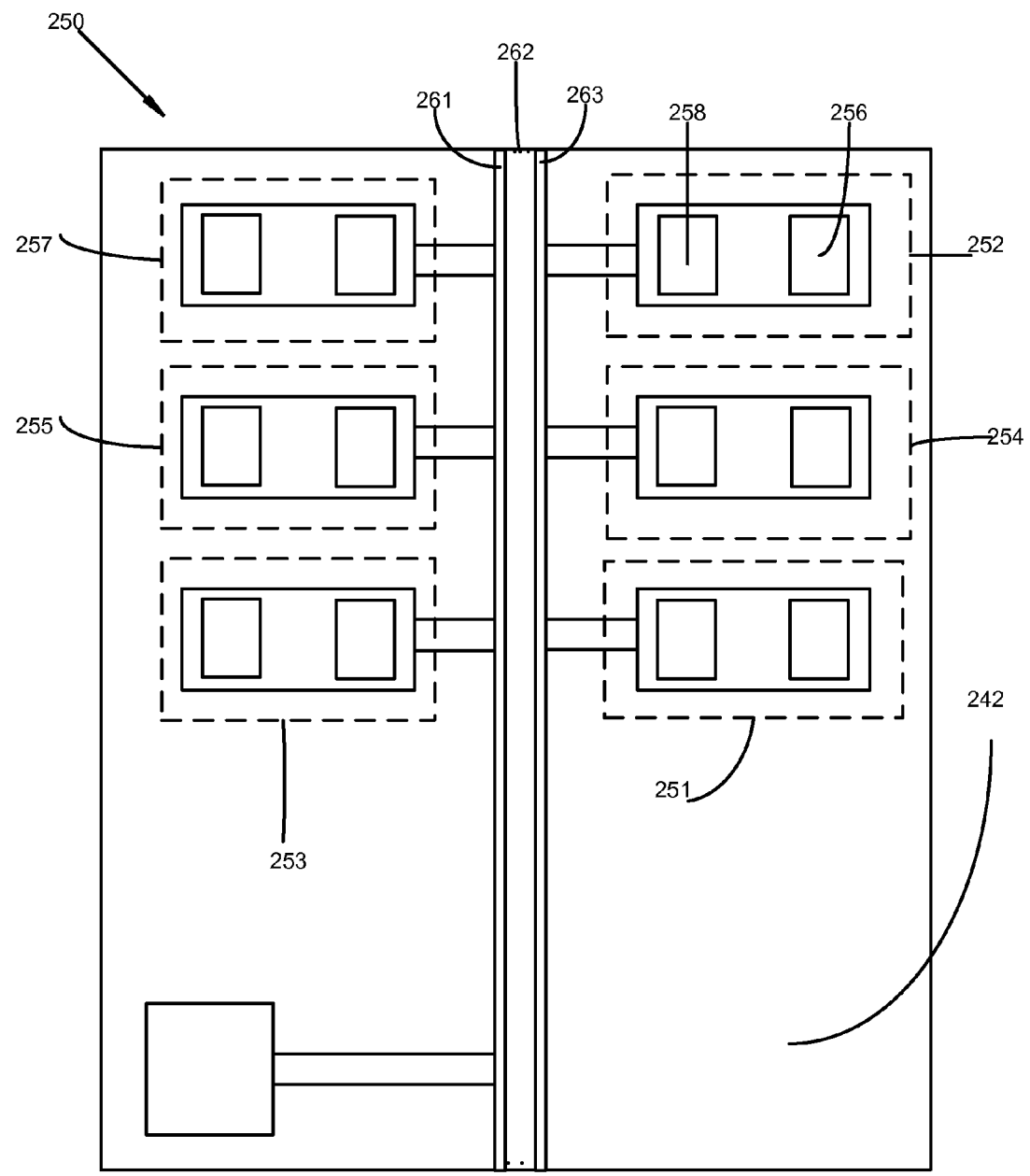
FIG. 6 is a layout view of a memory cell array described in FIG. 5 with an oxide growth barrier layer within the conductive line trench before the conductive line is formed.

FIG. 6 is a layout view of a memory cell array described in FIG. 5 with an oxide growth barrier layer within the conductive line trench before the conductive line is formed. The layout view is otherwise similar to FIG. 4.

A first oxidation barrier layer 261 and second oxidation barrier layer 263 are disposed along opposing sidewalls of the trench 262. Such oxidation barrier layers 261 and 263 cover the surface of a respective one of the sidewalls of the trench 262. The oxidation barrier layers 261 and 263 serve to limit growth of the metal oxide memory elements of each memory cell stacked structure 251, 252, 253, 254, 255 and 257 into the trench 262 during the oxidation process. Furthermore, the conductive line that is deposited within the trench 262 can adhere more easily to the oxide barrier layers 261 and 263 than to the surfaces of the metal oxide memory elements of each memory cell stacked structure 251, 252, 253, 254, 255 and 257.

Figure 7:
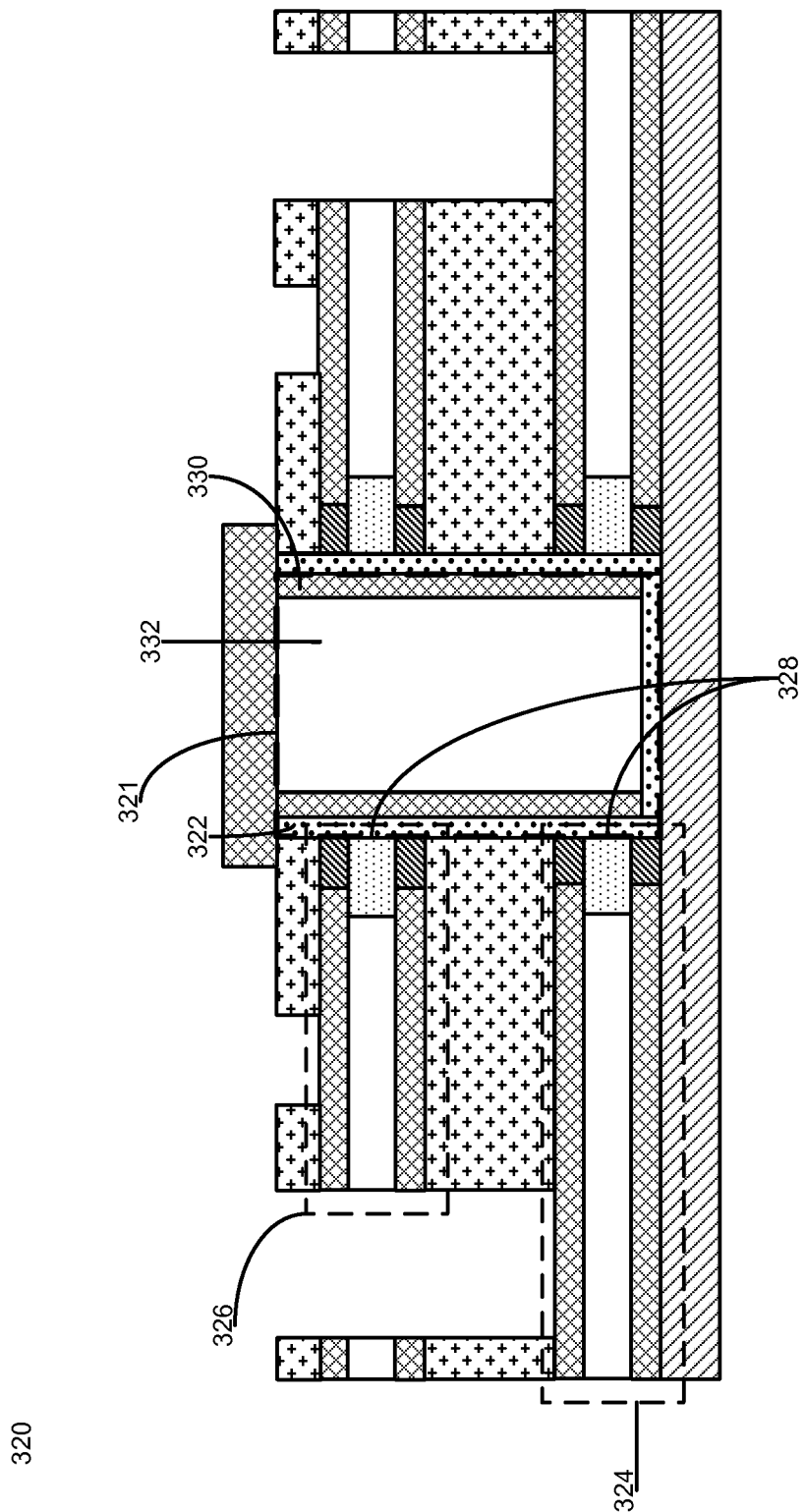
FIG. 7 is a cross sectional view of a memory cell array of a stacked structure with a drive device layer that regulates current flow within the memory element of each memory cell during program and read operation.

FIG. 7 shows a cross sectional view of an alternate embodiment of a stacked memory cell array structure 320 with a drive device layer 322. The stacked memory cell array structure 320 in FIG. 6 includes a first memory cell 324 and second memory cell 326. The memory cells 324 and 326 within the stacked structure can be resistive metal oxide memory cells of the same structure as previously described. The drive device layer 322 is formed within the trench 321, along sidewalls of the trench 321, such that it makes contact with the memory element surfaces 328. In the embodiment shown in FIG. 6, a conductive line is formed within the trench, around the driven device layer 322 such that the driven device layer 322 is positioned directly between the memory element surfaces 328 and the conductive line. The conductive line, as in the illustrated embodiment, can include a barrier metal layer 330 and a metal layer 332.

Alternatively, an oxide growth barrier layer can be positioned between the driven device layer 322 and the memory element surfaces 328. The oxide growth barrier layer serves to limit the growth of the resistive metal oxide memory elements into the trench 321 during the oxidation process. Furthermore, the oxide growth barrier layer creates a surface upon which the drive device layer 322 can adhere to more easily during formation of the drive device layer.

The drive device layer 322 can be of any structure and material that is capable of regulating current in one direction through the memory cells of the stacked memory cell structure 320. In one embodiment, a diode can be used to regulate the current through the memory cells. The diode can be of any diode structure and comprise any material that is suitable for making such diode structure. For example, the drive device layer 322 can be a metal oxide diode structure. Alternatively, the driven device layer 322 can be a tunneling diode structure. The drive device layer 322 serves to control the current within a given memory cell or group of memory cells, during read and program operations. Biasing the drive device layer 322 so that current flows through a given memory cell creates a selection mechanism whereby those memory cells with current flowing through them can then be read or programmed.

Through the use of the stacked memory cell structure 320, wherein the memory element surfaces 328 make up a portion of a sidewall of the trench 321, the drive device layer 322 is easily incorporated within the structure through a simple deposition process. Beyond ease of manufacturing, incorporating the drive device layer 332 along the sidewall of the stacked memory cell structure 320 helps to ensure that the entire memory element surfaces 328 make electrical contact with the drive device layer 322.

Figure 8:
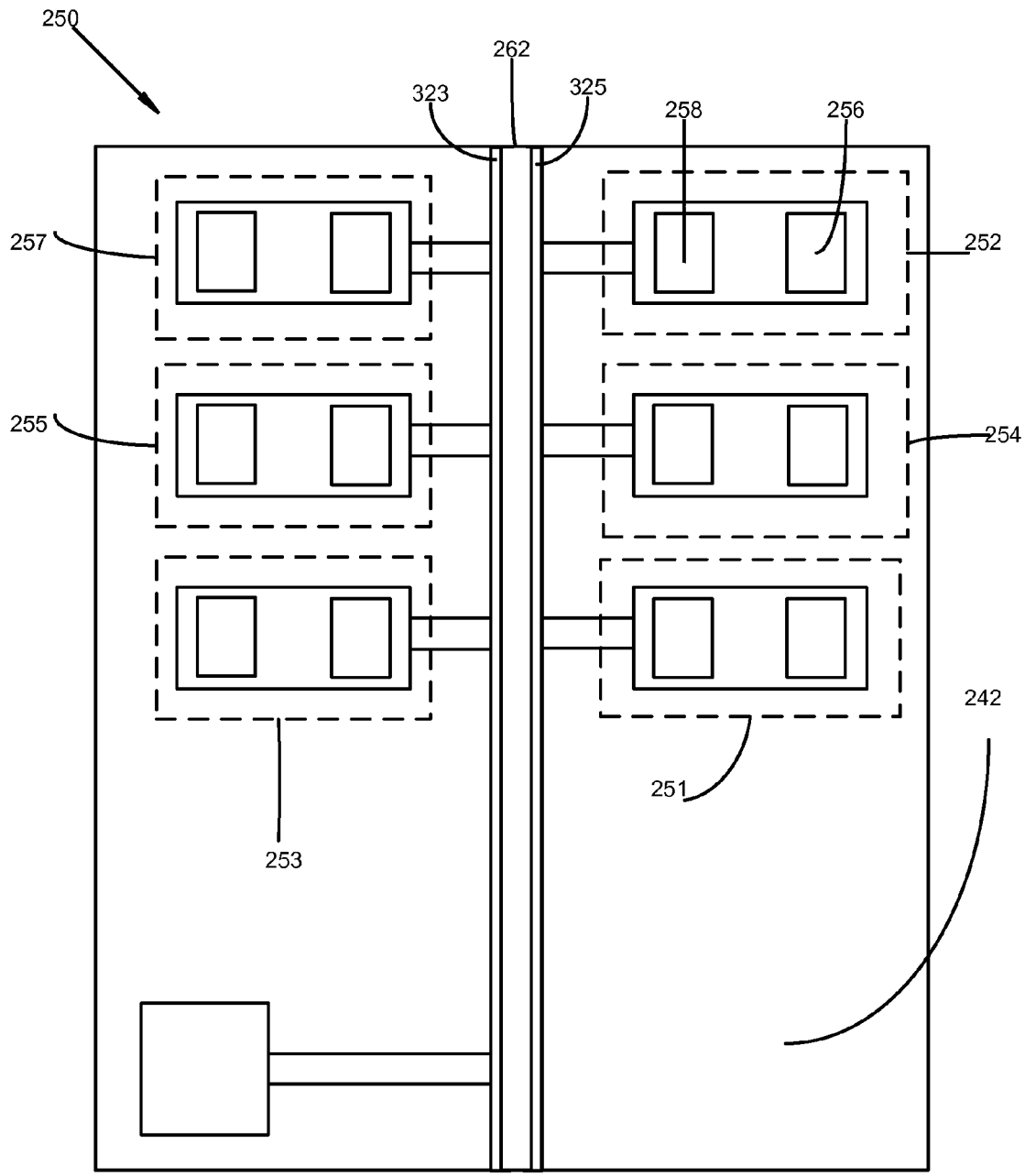
FIG. 8 is a layout view of a memory cell array as described in FIG. 7 with a drive device layer within the conductive line trench before the conductive line is formed.

FIG. 8 is a layout view of a memory cell array as described in FIG. 7 with a drive device layer within the conductive line trench before the conductive line is formed. The layout view is otherwise similar to FIG. 4.

A first drive device layer 323 and a second drive device layer 325 are formed along opposing sidewalls of the trench 262 before the conductive line is formed within the trench 262. The drive device layers 323 and 325 are formed along opposing sidewalls of the trench 262, and are disposed between the respective metal oxide memory elements of the memory cell stacked structures 251, 252, 253, 254, 255 and 257 and the conductive line that is formed within the trench 262. The drive device layers 323 and 325 serve to control the current that flows through the metal oxide memory element of the memory cell stacked structures 251, 252, 253, 254, 255 and 257 by limiting the current that flows between the corresponding metal oxide memory elements and the conductive line.

Figure 9:
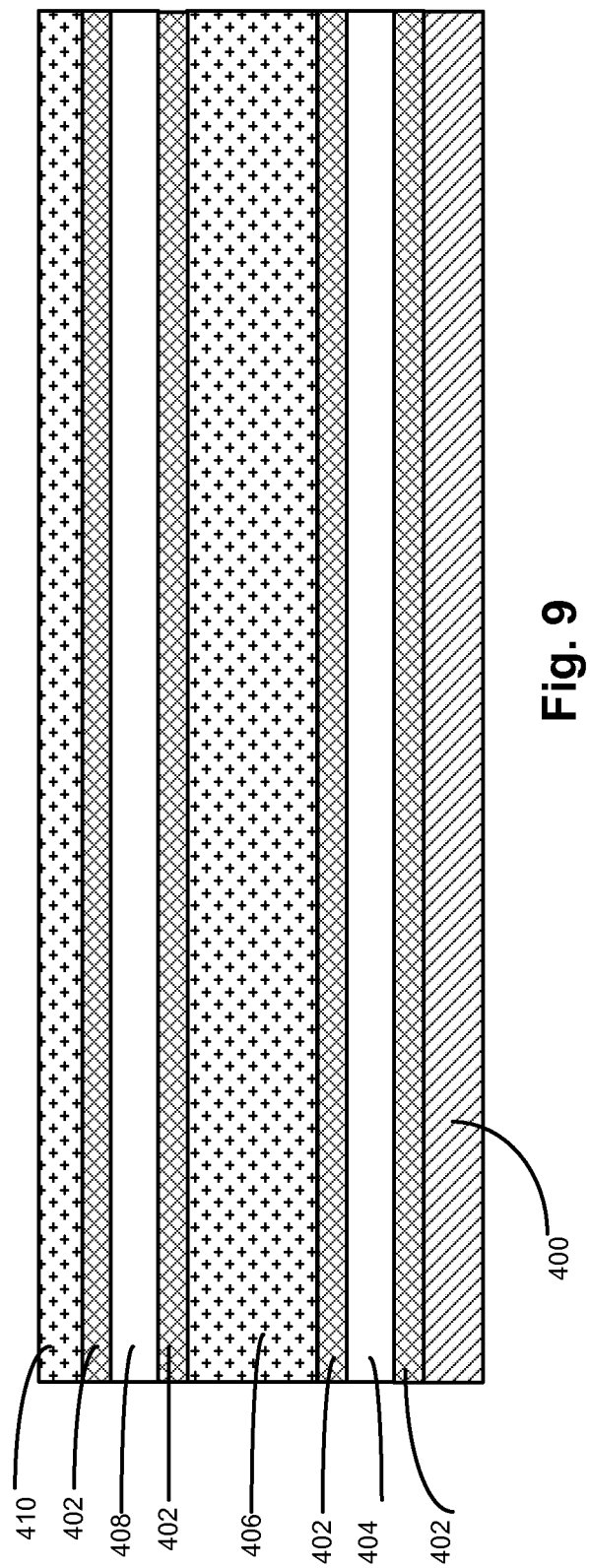
FIG. 9 is a cross sectional view of a memory cell array of a stacked structure after deposition of the layers of material that form the memory cells.

FIGS. 9-15 illustrate the steps in various methods for fabricating memory cell array structures of the previously described embodiments. FIG. 9 shows a cross sectional view of the stacked structure after the deposition of the layers that form the memory cell array stacked architecture but before the etching steps. The stacked structure includes a plurality of conductive pad layers. The stacked structure is formed on top of a substrate 400. The substrate 400 can be of any material suitable for forming a memory cell on top of such substrate. In the shown embodiment, the substrate 400 is SiO2. The substrate 400 can be of a dielectric material that does not conduct charge unless it is placed in an electric field.

The first memory cell is formed within a first conductive pad layer that includes a first memory cell stack of barrier metal layer 402, metal 404 and barrier metal layer 402. The barrier metal layers 402 and metal layer 404 can be of any of the previously mentioned materials. The metal layer 404 is preferably of a metal that as an oxide acts as a resistive metal oxide memory element. A first isolation layer 406 is formed on top of the first memory cell stack of first memory cell barrier metal layer 402, metal layer 404 and barrier metal layer 402. The first isolation layer 406 serves to isolate the memory cell that is formed with the first memory cell stack from the memory cell formed on top of the isolation layer 406.

A second memory cell is formed within a second conductive pad layer that includes a second memory cell stack of barrier metal layer 402, metal layer 408 and barrier metal layer 402, that is deposited on top of the insulation layer 406. The barrier metal layers 402 and metal layer 408 can be of the same materials that are used to form barrier metal layers 402 and metal layer 404 of the first memory cell stack. A second isolation layer 410 is deposited on top of the second memory cell stack. The second isolation layer 410 serves to electrically isolate the memory cells that are formed in the second memory cell stacks, from materials on top of the second isolation layer 410. The first and second isolation layers 406 and 410 can be of any suitable material, as previously described, that is capable of electrically isolation the memory cells. In the shown embodiment, the isolation layers 406 and 410 are SiN.

Figure 10:
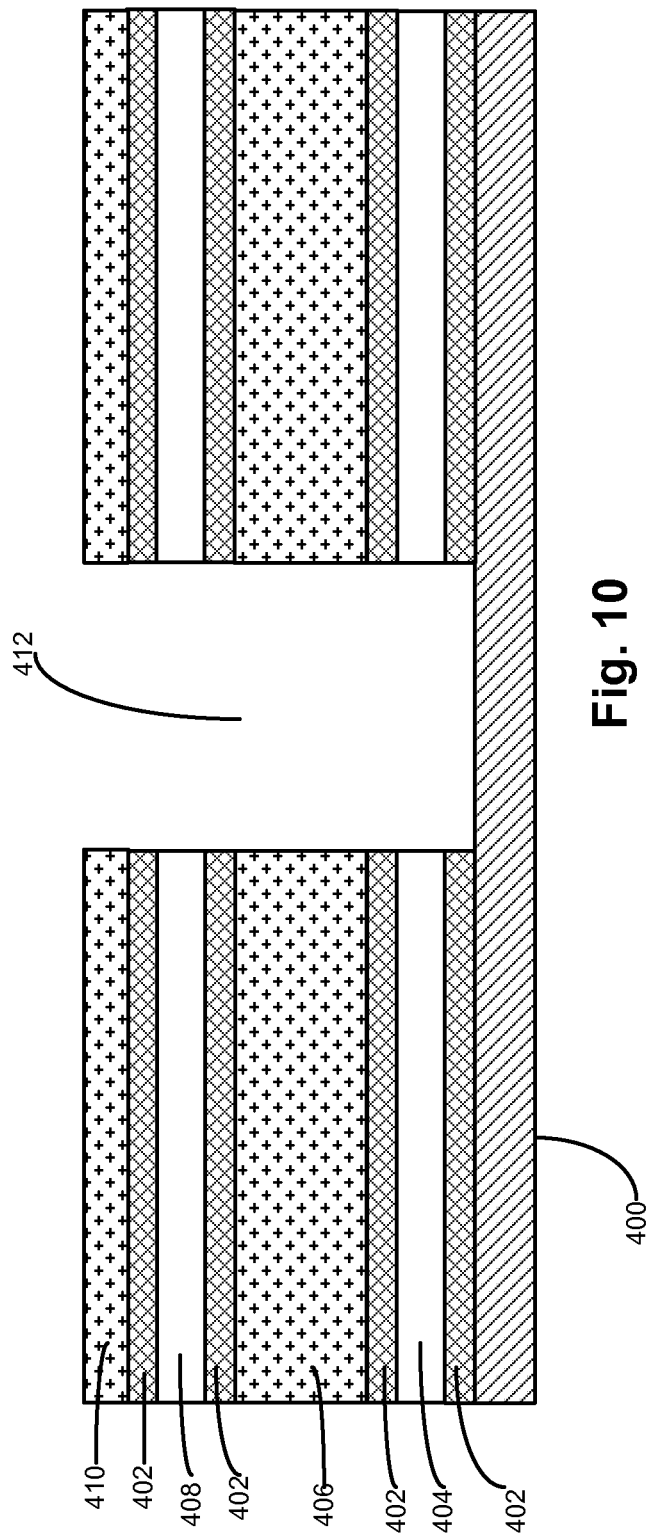
FIG. 10 is a cross sectional view of a memory cell array of a stacked structure after the step of formation of a conductive line trench.

FIG. 10 is a cross sectional view of the stacked structure after formation of the trench 412. After the conductive pad layers are deposited, as described in FIG. 9, a trench 412 is formed that extends to the substrate. The trench 412 is etched to the substrate layer though the conductive pad layers forming a plurality of conductive pads. The conductive pads are formed along adjacent sides of the trench 412, wherein each conductive pad has a proximal side that corresponds to a side of the trench. More specifically, the trench 412 is formed by etching through the second isolation layer 410, the second memory cell stack (which includes a stack of top barrier metal layer 402, metal layer 408, and bottom barrier metal layer 402), the first isolation layer 406, and the first memory cell stack (which includes a stack of top barrier metal layer 402, metal layer 404, and bottom barrier metal layer 402). The trench 412 is formed by etching through such layers to the substrate material 400 such that the top surface of the substrate material 400 makes up the bottom of the trench 412.

Figure 11:
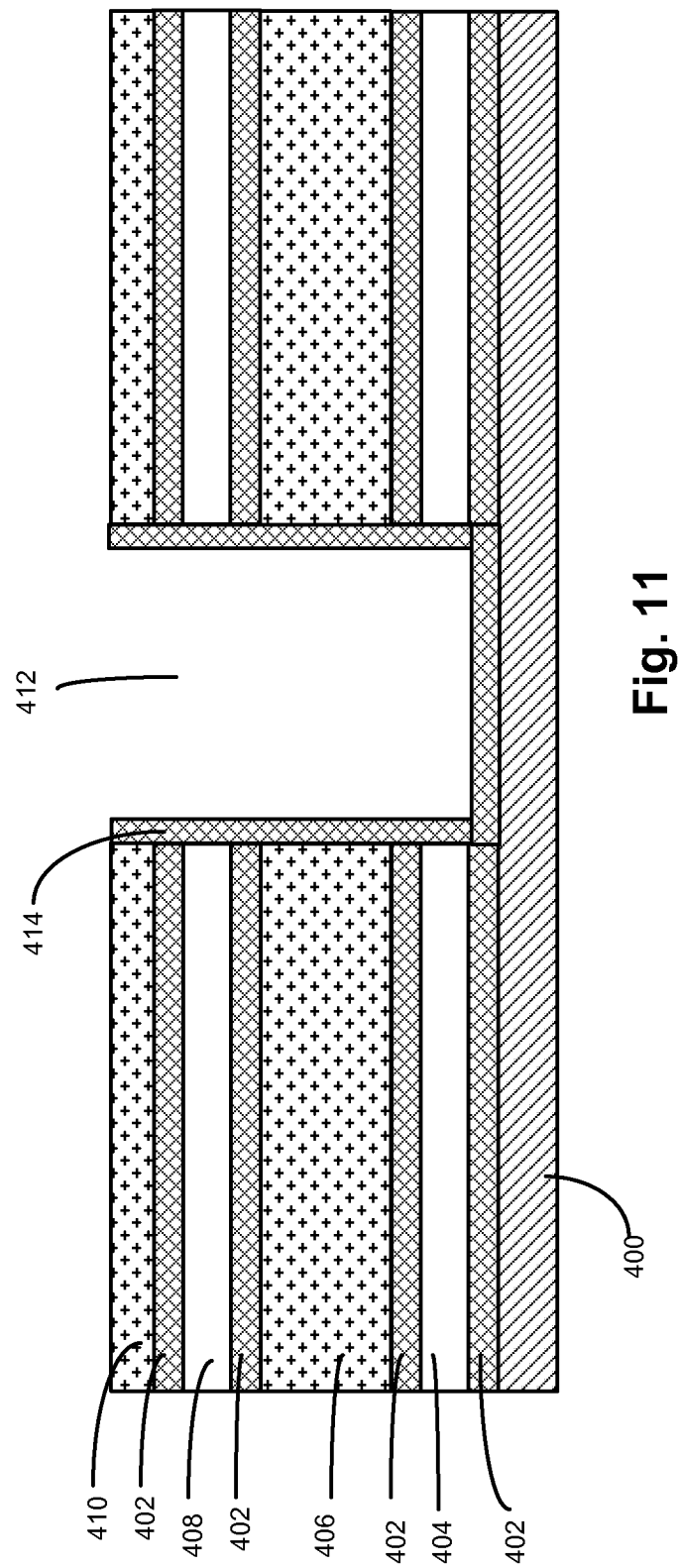
FIG. 11 is a cross sectional view of a memory cell array of a stacked structure after the step of depositing an oxide growth barrier layer.

FIG. 11 is a cross sectional view of the memory cell array of a stacked structure of an alternate embodiment after the step of depositing an oxide barrier growth layer 414 after forming the trench 412. In this step, according to an alternate embodiment, an oxide growth barrier layer is formed within the trench 412 after the step of forming the conductive line trench 412. As mentioned previously, the oxide growth barrier layer 414 serves to prevent the growth of the resistive metal oxide element into the shared trench 412 during the oxidation process. Furthermore, the oxide growth barrier layer 414 provides a surface upon which the conductive line that forms the common line or a driven device layer can bond to more easily than the memory element surface. The oxide growth barrier layer 414 can be deposited using any suitable method including chemical vapor deposition or physical vapor deposition. The oxide growth barrier layer 414 is deposited so that a layer is formed along the sidewalls of the trench 412. The oxide growth barrier layer can be any material that is suitable for allowing oxygen atoms to diffuse through the oxide growth barrier layer during the oxidation process and for conducting charge out of the resistive metal oxide memory elements to the conductive line during memory cell program and read operations. As illustrated in FIG. 9, the oxide growth barrier layer is TiN.

Figure 12:
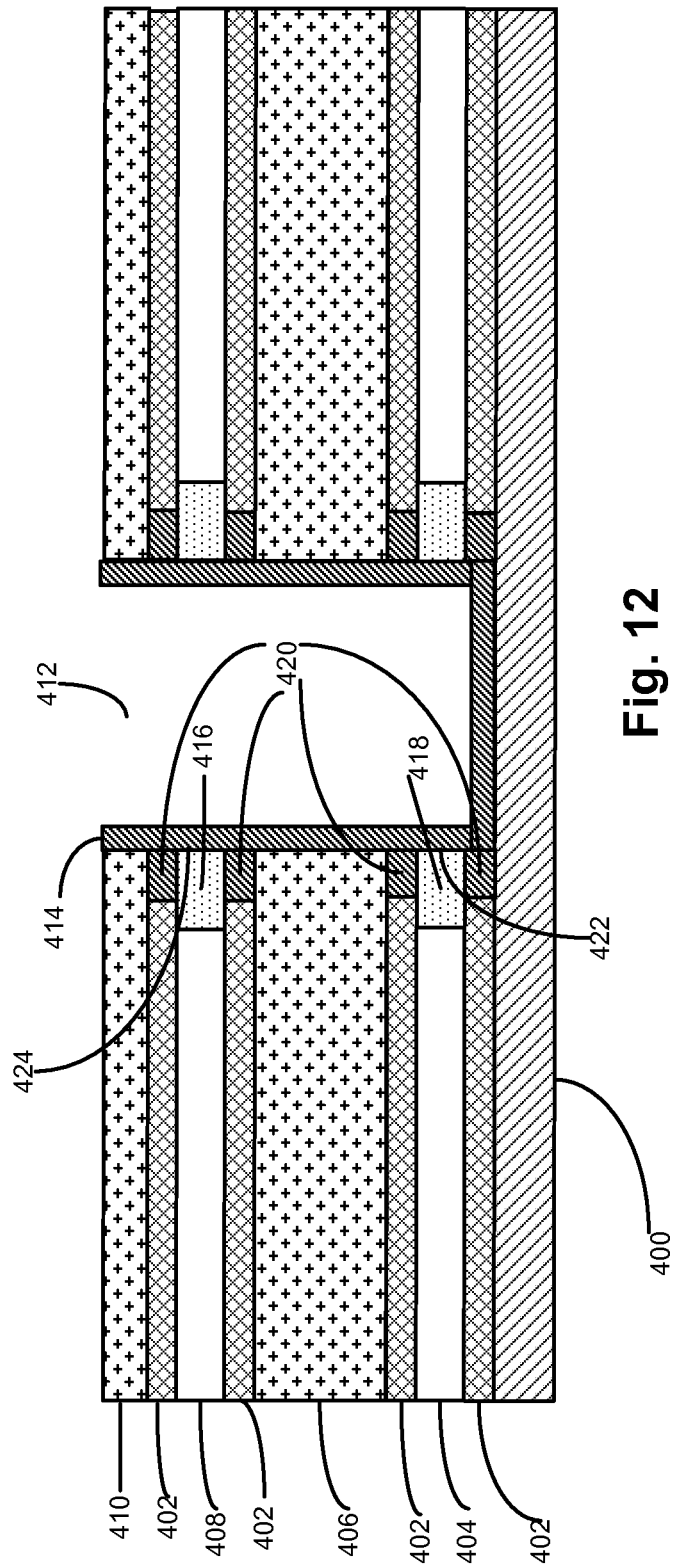
FIG. 12 is a cross sectional view of a memory cell array of a stacked structure after the step of oxidation to form the resistive metal oxide memory elements.

FIG. 12 is a cross sectional view of the memory cell array of a stacked structure after oxidation to form the resistive metal oxide memory elements 416 and 418 of the first and second memory cells. During the oxidation process the layers within the trench are oxidized such that a portion of the metal layers 408 and 404 are oxidized to form resistive metal oxide memory elements 418 and 416. The oxidation step can occur with or without an oxide growth barrier layer 414. The oxide growth barrier layer can be of a material that oxidizes such as in the illustrated embodiment, thereby forming an oxidized oxide growth barrier layer 414. In the embodiment shown in FIG. 10 the oxide growth barrier layer is TiN and oxidizes to form TiNOx. The resistive metal oxide memory elements 416 and 418 form resistive metal oxide memory element contact interfaces 422 and 424 through which current passes into and out of the resistive metal oxide memory elements 422 and 424.

In the embodiment shown in FIG. 12, the step of oxidation also includes forming field enhancement layers 420 on a portion of at least one of the top and bottom horizontal surfaces of the resistive metal oxide memory elements 416 and 418. The field enhancement layers 420 can be formed such that the resistive metal oxide memory elements 416 and 418 are sandwiched between such field enhancement layers 420. The field enhancement layers are formed from a material with a low conductivity, so that the current that passes through barrier metal layers 402 is directed out of the barrier metal layers 402 and into the resistive metal oxide memory elements 416 and 418. This increases the current within the resistive metal oxide memory elements, allowing for the achievement of suitable read and program current levels at lower overall memory array operational currents. In the illustrated embodiment, the field enhancement layers are formed by oxidizing a portion of the barrier metal layers 402 during the oxidation process. As illustrated, the field enhancement layers can be formed from a TiNO material. In an alternative embodiment, the field enhancement layers 420 are not formed.

Figure 13:
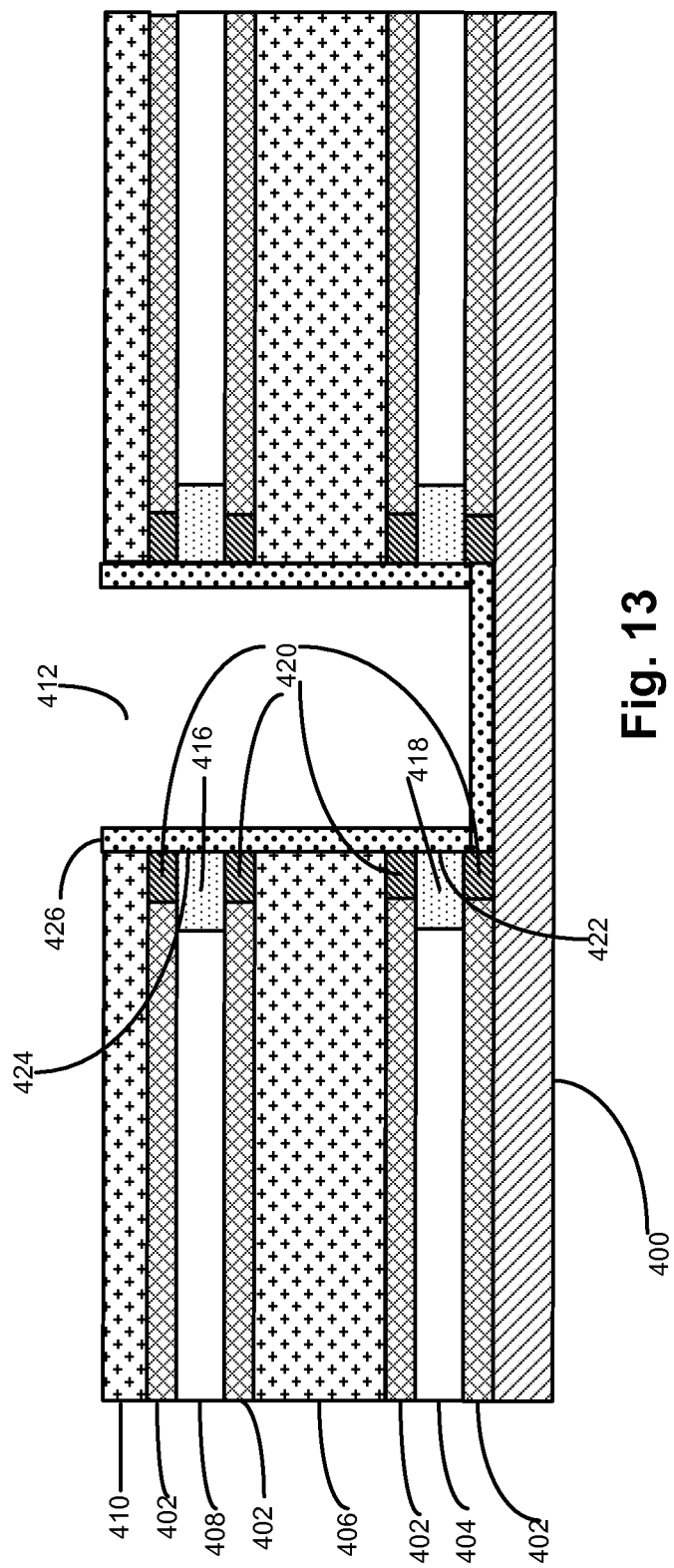
FIG. 13 is a cross sectional view of a memory cell array of a stacked structure after the step of forming a drive device layer within the shared trench.

FIG. 13 is a cross sectional view of a memory cell array of the stacked structure after the alternate embodiment step of forming a drive device layer 426 within the trench after the step of oxidation. The drive device layer 426 can be formed through deposition after the first and second resistive metal oxide memory elements 416 and 418 are formed through oxidation. As discussed previously, the drive device layer 426 can be formed of any suitable material and structure that is capable of regulating the current through the resistive metal oxide memory elements 416 and 418. For example, the drive device layer 426 can be either a metal-oxide diode or a tunneling diode. Furthermore, the drive device layer 426 can be formed with a structure that utilizes an oxide growth barrier layer such that the drive device layer 426 is deposited on top of the oxide growth barrier layer.

Figure 14:
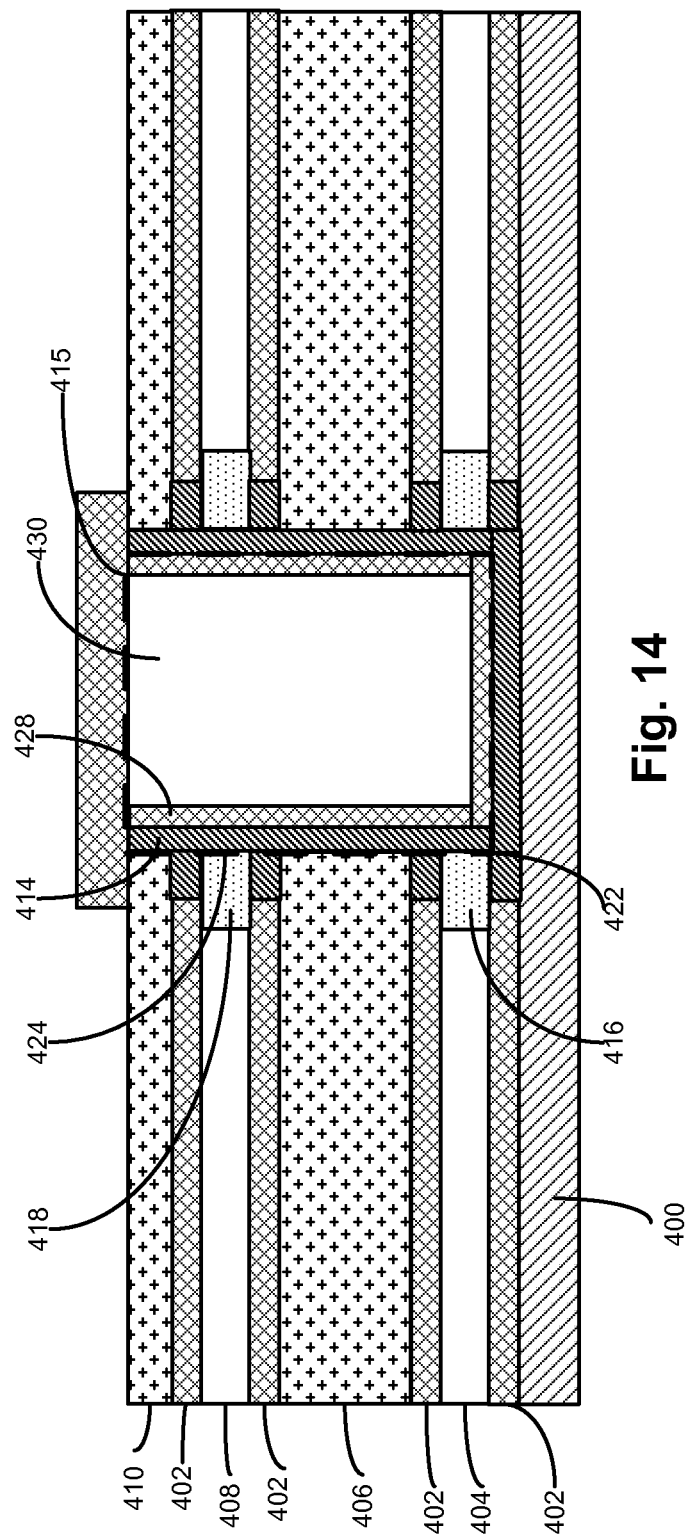
FIG. 14 is a cross sectional view of a memory cell array of a stacked structure after the step of forming the conductive line within the shared trench.

FIG. 14 is a cross section view of the stacked structure of an alternate embodiment including an oxide growth barrier layer 414 after formation of the conductive common line within the trench 415. The step of forming a conductive common line within the trench 415 can include depositing a barrier metal layer 428 and a metal layer 430 within the trench 415. More specifically, a barrier metal layer 428 is deposited on top of the oxide growth barrier metal layer within the trench 415. The remainder of the trench 415 is filled with a metal 430, and a barrier metal layer 428 is deposited on top of the trench 415 so that the metal 430 is completely encapsulated by the barrier metal layer 428. The barrier metal layer 428 and the metal 430 can be formed from any of the previously described barrier metal or metal materials. The conductive line can be formed with or without an oxide growth barrier layer 414 within the trench 415 or with or without a drive device layer within the trench 415, or any combination of the two different embodiments.

Figure 15:
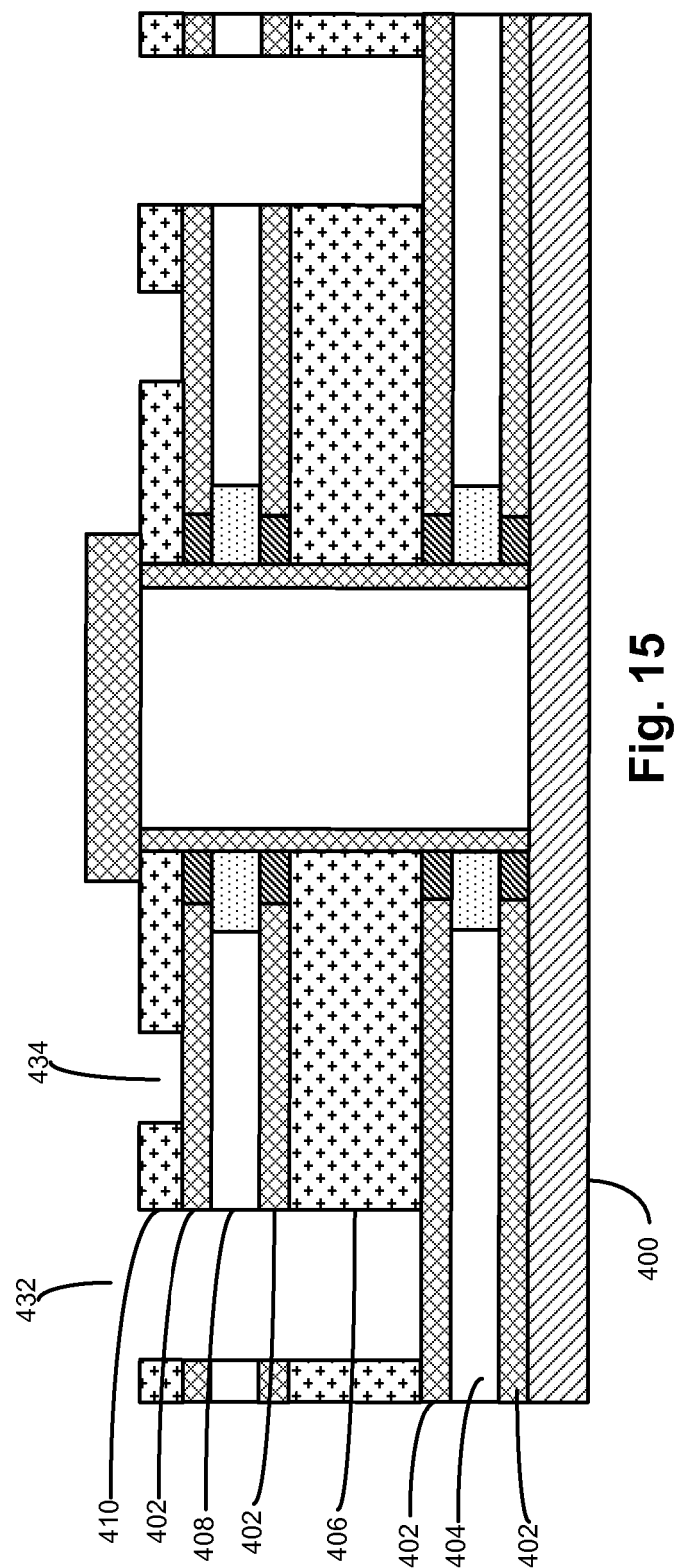
FIG. 15 is a cross sectional view of a memory cell array of a stacked structure after the step of forming a first and second memory cell back electrode trench.

FIG. 15 is a cross sectional view of the stacked structure of an alternate embodiment structure without an oxide growth barrier layer or a drive device layer after the step of forming an array of vertical connectors which includes forming the first and second back vias 432 and 434. The first back via 432 is formed by the steps of etching through the second isolation layer 410, the second memory cell stack (which includes a stack of top barrier metal layer 402, metal layer 408, and bottom barrier metal layer 402), and the first isolation layer 406. The etch exposes the top surface of the first memory cell stack (i.e. the surface of the top barrier metal layer 402 of the first memory cell stack). The step of forming the first back via 432 further includes filling the via with a conductive material such that an electrical contact is formed with the overlying circuitry and the first memory cell. The step of forming the array of vertical connectors also can include the step of etching through the second isolation layer 410 so that a second back via 434 is formed that extends to the top barrier metal layer 402 of the second memory cell stack. The step of forming the second back via 434 includes filling the back via with a conductive material to make an electrical contact with the second memory cell. The first and second memory cell back vias are physically and electrically isolated from each other so that the memory cells can be selectively programmed and read. While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device comprising:
   a conductive line having first and second sides;
   a plurality of levels of a plurality of conductive pads disposed adjacent the first and second sides of the conductive line, the plurality of conductive pads having proximal sides proximal to a corresponding one of the first and second sides of the conductive line;
   metal oxide memory elements on the proximal sides of the plurality of conductive pads in the plurality of levels, and in electrical communication with the corresponding ones of the first and second sides of the conductive lines; and
   an array of vertical connectors, the vertical connectors in electrical communication with respective conductive pads in the plurality of levels and overlying circuitry,
   wherein the plurality of conductive pads each include a metal layer between one of the metal oxide memory elements and one of the array of vertical connectors,
   wherein the metal oxide memory elements comprise an oxide of the metal layer, such that the metal oxide memory element is disposed along the proximal side of the metal layers in the conductive pads, and
   wherein the plurality of conductive pads further include a plurality of barrier metal layers in which the metal layer is disposed between at least two of the barrier metal layers.

2. The integrated circuit device of claim 1, wherein at least two of the plurality of conductive pads are stacked such that at least a first conductive pad is disposed above a second conductive pad, and the first conductive pad has a distal side that is disposed closer to the conductive line than the distal side of the second conductive pad, the distal sides of the first and second conductive pads in electrical communication with corresponding ones of the array of vertical connectors.

3. The integrated circuit device of claim 1, wherein the plurality of conductive pads further include field enhancement structures adjacent to proximal ends of the metal oxide memory elements proximal to the corresponding one of the first and second sides of the conductive lines.

4. The integrated circuit device of claim 1, wherein an oxide growth barrier layer is disposed between at least one of the metal oxide memory elements and one of the corresponding first and second sides of the conductive line.

5. The integrated circuit device of claim 1, wherein a drive device layer is disposed between at least one of the metal oxide memory elements and one of the corresponding first and second sides of the conductive line.

6. The integrated circuit device of claim 1, wherein the overlying circuitry includes word lines coupled to the array of vertical connectors.

7. The integrated circuit device of claim 1, wherein the conductive line is a bit line.

8. A method comprising:
   forming a plurality of levels of a plurality of conductive pads adjacent to a first and a second sidewall of a trench, the plurality of conductive pads having proximal sides proximal to a corresponding one of the first and second sidewalls of the trench;
   forming a plurality of metal oxide memory elements on the proximal sides of the plurality of conductive pads;
   forming a conductive line within the trench such that the conductive line is in electrical communication with the plurality of metal oxide memory elements; and
   forming an array of vertical connectors, the vertical connectors in electrical communication with respective conductive pads in the plurality of levels and overlying circuitry;
   wherein conductive pads in the plurality of conductive pads include a metal layer between one of the metal oxide memory elements and one of the array of vertical connectors;
   wherein the metal oxide memory elements comprise an oxide of the metal layer, such that the metal oxide memory element is disposed along the proximal side of the metal layers in the conductive pads; and
   wherein the plurality of conductive pads further includes a plurality of barrier metal layers in which the metal layer is disposed between at least two of the barrier metal layers.

9. The method of claim 8, wherein said forming the plurality of levels of the plurality of conductive pads further comprises depositing a plurality of conductive pad layers, the conductive pad layers including a first metal layer between a first barrier metal layer and a second barrier metal layer.

10. The method of claim 9, wherein said forming the plurality of metal oxide memory elements includes oxidizing a portion of the metal layer to form at least one resistive metal oxide memory element.

11. The method of claim 8, further including:
   forming field enhancement structures adjacent to proximal ends of the metal oxide memory elements proximal to the corresponding one of the first and second sidewalls of the trench.

12. The method of claim 8, further including:
   forming an oxide growth barrier layer along the first and second sidewalls of the trench before forming the plurality of metal oxide memory elements.

13. The method of claim 8, further including:
   forming a drive device layer along the first and second sidewalls of the trench.

14. The method of claim 8, wherein the step of forming an array of vertical connectors includes the steps of:
   forming cavities through material overlying the respective conductive pads;
   forming an insulating layer along the sides of the cavities; and,
   filling the cavities with at least one conductive material.

15. The method of claim 8, further including:
   forming word lines coupled to the array of vertical connectors.

16. The method of claim 8, wherein the conductive line is a bit line.

* * * * *